(12) United States Patent
Tsaur et al.

(10) Patent No.: US 7,768,611 B2
(45) Date of Patent: Aug. 3, 2010

(54) DISPLAY SYSTEM WITH SINGLE CRYSTAL SI THIN FILM TRANSISTORS

(75) Inventors: Bor-Yeu Tsaur, Lexington, MA (US); Hong K. Choi, Sharon, MA (US); Jason Lo, Westborough, MA (US)

(73) Assignee: Kopin Corporation, Taunton, MA (US)

( * ) Notice: Subject to any disclaimer, the term of this patent is extended or adjusted under 35 U.S.C. 154(b) by 242 days.

(21) Appl. No.: 11/893,594

(22) Filed: Aug. 16, 2007

(65) Prior Publication Data

US 2008/0049159 A1 Feb. 28, 2008

Related U.S. Application Data

(60) Provisional application No. 60/838,014, filed on Aug. 16, 2006.

(51) Int. Cl.
*G02F 1/1343* (2006.01)
*G02F 1/1339* (2006.01)

(52) U.S. Cl. .............. 349/139; 349/155

(58) Field of Classification Search ............ 349/139, 349/155
See application file for complete search history.

(56) References Cited

U.S. PATENT DOCUMENTS

| | | | |
|---|---|---|---|
| 5,206,749 A | 4/1993 | Zavracky et al. | |
| 5,256,562 A | 10/1993 | Vu et al. | |
| 5,705,424 A | 1/1998 | Zavracky et al. | |
| 6,496,170 B1 * | 12/2002 | Yoshida et al. | 345/87 |
| 6,559,477 B2 * | 5/2003 | Tada et al. | 257/59 |
| 6,566,178 B2 * | 5/2003 | Shih | 438/163 |
| 6,608,654 B2 | 8/2003 | Zavracky et al. | |
| 7,138,993 B2 | 11/2006 | Herrmann | |
| 2002/0039814 A1 * | 4/2002 | Jada et al. | 438/155 |
| 2002/0093019 A1 * | 7/2002 | Hirabayashi et al. | 257/71 |
| 2004/0021805 A1 * | 2/2004 | Nagata et al. | 349/43 |
| 2007/0200986 A1 * | 8/2007 | Ong | 349/117 |

OTHER PUBLICATIONS

Richard, A. and Herrmann, F. P., "A New Drive-Scheme Architecture for AMLCDs Used in Microdisplays," *Information Displays*, pp. 14-17 (2005).

* cited by examiner

*Primary Examiner*—K. Cyrus Kianni
(74) *Attorney, Agent, or Firm*—Hamilton, Brook, Smith & Reynolds, P.C.

(57) ABSTRACT

A liquid crystal display comprises a display panel that includes at least one pixel transistor, at least one pixel electrode in electrical communication with the pixel transistor, at least one common electrode, and a liquid crystal material between the pixel electrode and the common electrode. The pixel transistor includes a thin film layer of essentially single crystal silicon that has a thickness in a range of between about 100 nm and about 200 nm. The pixel electrode has a thickness in a range of between about 5 nm and about 20 nm. The common electrode has a thickness of between about 50 nm and about 200 nm.

25 Claims, 6 Drawing Sheets

DISPLAY SYSTEM WITH SINGLE CRYSTAL SI THIN FILM TRANSISTORS

RELATED APPLICATION

This application claims the benefit of U.S. Provisional Application No. 60/838,014, filed on Aug. 16, 2006, the entire teachings of which are incorporated herein by reference.

BACKGROUND

Active matrix color liquid crystal displays (LCDs) generally include five different components: a white light source, a first polarizing film that is mounted on one side of a display panel including an array of pixels defined by arrays of pixel electrodes and thin-film pixel transistors (TFTs), a color filter plate containing at least three primary colors arranged into pixels covered with a transparent common electrode and finally a second polarizing film. A liquid crystal material is disposed between the pixel and common electrodes. This material will rotate the polarization of light when an electric field is applied across it. Thus, when a particular pixel of the display is turned on, the liquid crystal material rotates polarized light transmitted through the material so that it will pass through the second polarizing filter.

For pixel TFTs, various types of silicon have been used, including amorphous silicon, polycrystalline silicon, and single crystalline silicon. Amorphous silicon TFTs generally have poor transistor performance because of very low electron mobility of amorphous silicon. As a result, the amorphous silicon TFTs can only deliver low current density, limiting their use to large-size LCD panels that can accommodate large-size TFTs. Polycrystalline silicon TFTs can in part address the problem associated with amorphous silicon TFTs because the electron mobility of polycrystalline silicon is much higher, but these materials still have a lower electron mobility than single crystalline silicon as they have crystalline defects (such as grain boundary) which can impact TFT performance. Single crystal TFTs have the highest performance, and they can be used for displays with very high pixel density, for example, higher than 100 pixels per inch. In addition, single crystal TFTs have high frequency response, allowing the control electronic circuits to be monolithically integrated within the display panel.

Generally, conventional single crystal TFTs employed in LCDs in the art have a relatively thick silicon layer, for example, having a thickness of about 300 nm or greater. With such thickness, the pixel TFTs may have relatively high photosensitivity (e.g., backlighting and/or ambient light photosensitivity), which can result in current leakage of pixel TFTs. Such current leakage of pixel TFTs, in turn, can cause a relatively low display contrast ratio and/or high image retention.

Thus, a need exists for a method of forming a high quality TFT at each pixel of an LCD that can address problems associated with conventional TFTs, especially forming TFTs that can operate at high speeds, that have reduced photosensitivity, and that can be fabricated easily and at low cost.

SUMMARY OF THE INVENTION

The present invention generally relates to liquid crystal displays (LCDs) employing at least one thin-film pixel transistor having a thin film layer of essentially single crystal silicon (Si) that has a thickness in a range of between about 100 nm and about 200 nm, and to methods of fabricating such LCDs using thin films of essentially single crystal silicon.

In one embodiment, the present invention is directed to a liquid crystal display. The liquid crystal display comprises a display panel that includes at least one pixel transistor, at least one pixel electrode in electrical communication with the pixel transistor, at least one common electrode, and a liquid crystal material between the pixel electrode and the common electrode. The pixel transistor includes a thin film layer of essentially single crystal Si that has a thickness in a range of between about 100 nm and about 200 nm. The pixel electrode has a thickness in a range of between about 5 nm and about 20 nm. The common electrode has a thickness of between about 50 nm and about 200 nm.

In another embodiment, the present invention is directed to a method of preparing a liquid crystal display as described above. The method includes forming at least one pixel transistor that includes a thin film layer of essentially single crystal Si that has a thickness in a range of between about 100 nm and about 200 nm. At least one pixel electrode having a thickness in a range of between about 5 nm and about 20 nm is formed, wherein the pixel electrode is in electrical communication with the pixel transistor. At least one common electrode having a thickness in a range of between about 50 nm and about 200 nm is formed. A liquid crystal layer including a liquid crystal material is formed between the pixel electrode and the common electrode.

An LCD of the invention, employing an array of pixel TFTs, each of which includes a thin film layer of essentially single crystal Si that has a thickness in a range of between about 100 nm and about 200 nm, can provide a high display contrast ratio. In particular, this thickness of the Si thin film layer is relatively very thin compared with a typical thickness of about 300 nm or greater of conventional transistors employed in LCDs in the art. With such relatively thin TFTs, photosensitivity of single crystal Si of the TFTs (backlighting and/or ambient light photosensitivity) can be substantially reduced, which results in reduction of current leakage of the TFTs. This reduction of current leakage of the TFTs can provide a relatively high display contrast ratio, even when LCDs, in which they are incorporated, are being used in ambient (or external) light environment, or when backlighting is very bright.

Also, an LCD of the present invention, employing TFTs of essentially single crystal Si, can provide better performance, such as higher pixel density and faster frequency response, than LCDs employing amorphous Si TFTs or polycrystalline TFTs.

The LCDs of the invention can be used for a variety of applications, including night visions, cell phones, personal computers, electronic viewfinders, for example, for camcorders and digital cameras, portable video eyewear to watch movies, music videos and sporting events on-the-go, and for playing games, etc.

DETAILED DESCRIPTION OF THE INVENTION

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

The present invention relates to LCDs employing at least one pixel transistor having a thin film layer of essentially single crystal Si that has a thickness in a range of between about 100 nm and about 200 nm, and to methods of fabricating such LCDs. As used herein, the term "essentially single crystal Si film" means a film of crystalline Si in which a majority of the crystalline Si shows a common crystalline orientation and extends over an area in a plane of the film for at least 0.01 cm$^2$. The term also includes a film of completely single crystal Si. Such films can be formed using any suitable technique known in the art.

In some embodiments, the pixel transistor is a metal-oxide thin film transistor that includes a drain, a source, a gate oxide layer over the silicon thin film layer, and a gate terminal over the gate oxide layer, wherein each of the drain and source independently are in electrical contact with the silicon thin film layer.

Figure 1:
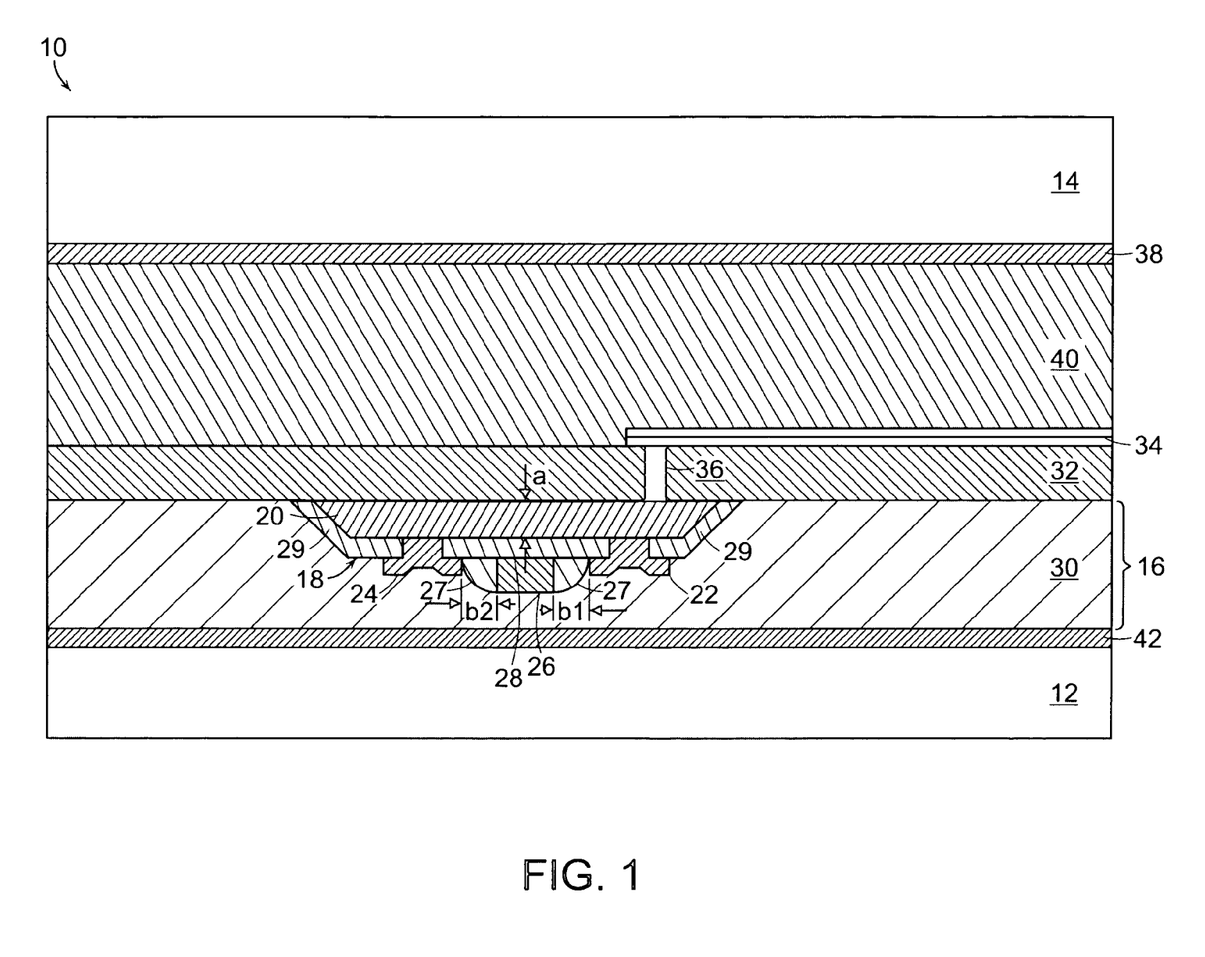
FIG. 1 is a schematic drawing showing a cross-sectional view of one embodiment of a liquid crystal display device of the invention.

FIG. 1 is a schematic cross-sectional view of one embodiment of the LCDs of the invention. Referring to FIG. 1, the LCD of FIG. 1 comprises display panel 10 that includes first transparent substrate 12 and second transparent substrate 14. TFT structure 16 that includes at least one thin-film pixel transistor ("pixel TFT") 18 and passivation layer 30. Insulating layer 32 separates TFT structure 16 from pixel electrode 34. Interconnect 36 provides electrical interconnection between pixel TFT 18 and pixel electrode 34. Pixel electrode 34 and common electrode 38 are partitioned by liquid crystal layer 40. Optional bonding layer 42 is located between first transparent substrate 12 and passivation layer 30.

Any suitable transparent substrate known in the art can be used for first and second transparent substrates 12 and 14. Suitable examples include glass, fused silica, sapphire, quartz, and transparent plastics. Preferably, glass, fused silica or sapphire is employed as first and second transparent substrates 12 and 14.

TFT structure 16, positioned between first and second transparent substrates 12 and 14, includes at least one pixel TFT 18, and passivation layer 30 disposed over a first major side of pixel TFT 18. Pixel TFT 18 includes thin film layer 20 of essentially single crystal Si ("Si thin film layer 20"), metal contacts 22 and 24, gate terminal 26, spacer 27, and gate oxide layer 28 that partitions Si thin film layer 20 and gate terminal 26 from each other. One of metal contacts 22 and 24 forms a drain of pixel TFT 18, while the other of the metal contacts forms a source of pixel TFT 18. Metal contacts 22 and 24 each independently are positioned on Si thin film layer 20 and in electrical communication with Si thin film layer 20. Insulating layer 29 is positioned at periphery of Si thin film layer 20, as shown in FIG. 1.

Si thin film layer 20 has a thickness ("a" shown in FIG. 1) in a range of between about 100 nm and about 200 nm. In one embodiment, the thickness is in a range of between about 150 nm and about 200 nm, such as about 200 nm.

Spacer 27 is positioned between at least one of gate terminal 26 and metal contact 22, and gate terminal 26 and metal contact 24, as shown in FIG. 1. In one embodiment, spacer 27 has a width ("b1" in FIG. 1), measured from a gate terminal-spacer boundary, in a range of between about 300 nm and about 800 nm. In another embodiment, spacer 27 has a width ("b2" in FIG. 1), measured from a gate terminal-spacer boundary, in a range of between about 300 nm and about 800 nm. In yet another embodiment, each of widths "b1" and "b2" independently is in a range of between about 500 nm and about 800 nm, such as about 600 nm.

Gate oxide layer 28 has a thickness in a range of between about 50 nm and about 150 nm, such as in a range of between about 50 nm and about 100 nm (e.g., about 70 nm or about 75 nm). Any suitable gate oxide material known in the art can be used in the invention for gate oxide layer 28. Suitable examples include silicon dioxide, silicon nitride and silicon oxynitride. In a certain embodiment, gate oxide layer 28 includes silicon dioxide.

Metal contacts 22 and 24 can be made of any suitable electrically conductive metal material, such as aluminum, copper or tungsten. Generally, gate terminal 26 controls electrical current flow between the metal contacts, i.e., source and drain. Examples of suitable gate materials include polysilicon, tantalum, tungsten, tantalum nitride and titanium nitride. Preferably, polysilicon is employed for gate terminal 26 in the invention. More preferably, the polysilicon gate terminal is doped with an n-type or a p-type dopant to lower its resistivity.

In a certain embodiment, pixel TFT 18 has gate terminal 26 that has a length in a range of between about 0.3 microns and about 1 micron, such as about 0.6 microns, and that has a width in a range of between about 1 micron and about 6 microns, such as about 4 microns. In another certain embodiment, pixel TFT 18 has a total thickness in a range of between about 250 nm and about 500 nm, such as between about 300 nm and 400 nm.

Insulating layer 32 is disposed over a second major side of pixel TFT 18, opposite to passivation layer 30. At least one pixel electrode 34 is positioned over insulating layer 32. Pixel electrode 34, and Si thin film layer 20 of pixel TFT 18 are partitioned from each other by insulating layer 32.

Interconnect 36 of suitable conductive metal, such as aluminum, titanium, titanium-tungsten, tungsten or copper, electrically connects pixel electrode 34 and Si thin film layer 20. Pixel electrode 34 can be formed from polysilicon or a transparent conductive material, such as indium tin oxide, or other metal oxides such as titanium dioxide or zinc oxide. Conductive nitrides, such as aluminum nitride, for example, can also be used. Preferably, pixel electrode 34 includes polysilicon, or alternatively indium tin oxide. Generally, pixel electrode 34 has a thickness in a range of between about 5 nm and about 20 nm.

Common electrode 38 can be formed from a transparent conductive material, such as indium tin oxide, or of other metal oxides, such as titanium dioxide or zinc oxide. Conductive nitrides, such as aluminum nitride, for example, can also be used. In a certain embodiment, common electrode 38 includes an indium tin oxide. Generally, common electrode 38 has a thickness in a range of between about 10 nm and about 20 nm.

Liquid crystal (LC) layer 40 includes a suitable LC material such as a twisted-nematic LC material or vertically aligned LC material. In nematic LCs, the LC molecules have no positional order when there is no external magnetic or electric field, but can be easily aligned by an external magnetic or electric field applied to them. Any suitable twisted nematic LC material known in the art can be used in the invention. Various types of such LC materials are commercially available, for example, from Merck KGa in Germany, such as MLC-6424, MLC-9000-000, MLC-9000-100, MLC-9300-000, MLC-9300-100, TL-203 and also, from Chisso, in Japan, LC materials, such as ZOC-5057-LA, and ZOC-5058-LA. LC material 40 is typically positioned between pixel electrode 34 and common electrode 38.

For bonding layer 42, preferably, transparent adhesives, such as transparent epoxy, are employed. Examples of suitable transparent adhesives can be found in the art, for example, in U.S. Pat. No. 5,256,562, the entire teachings of which are incorporated herein by reference.

Figure 2:
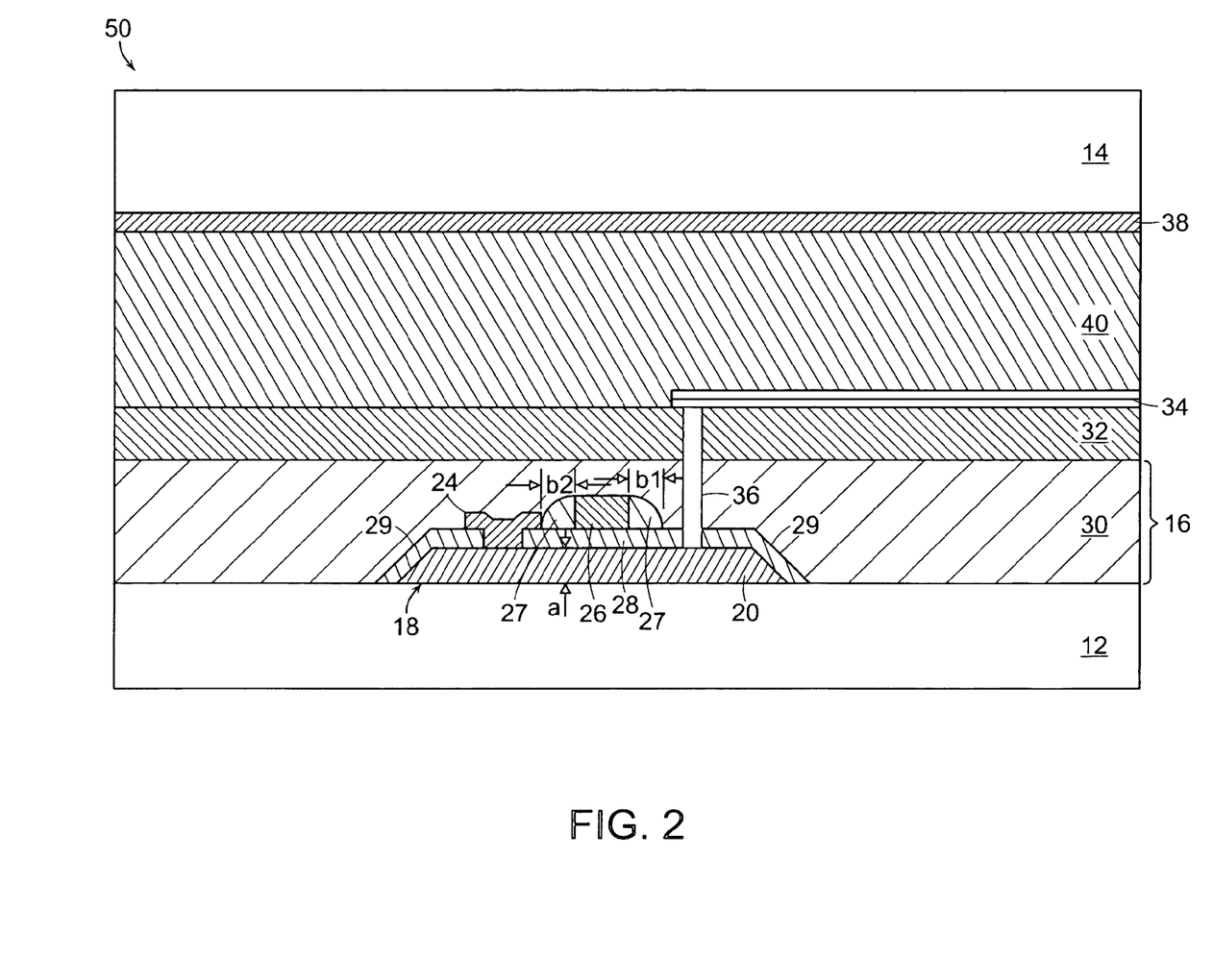
FIG. 2 is a schematic drawing showing a cross-sectional view of another embodiment of a liquid crystal display device of the invention.

FIG. 2 shows a schematic cross-sectional view of another embodiment of an LCD of the invention. Referring to FIG. 2, display panel 50 includes first and second transparent substrates 12 and 14, and TFT structure 16 between first and second transparent substrates 12 and 14. TFT structure 16 includes at least one pixel TFT 18 and passivation layer 30 that is positioned over a first major surface of pixel TFT 18, opposite to first transparent substrate 12. Insulating layer 32 is positioned over passivation layer 30. Pixel electrode 34 is positioned over insulating layer 32. Pixel electrode 34 and pixel TFT 18 are in electrical communication with each other via interconnect (or via) 36. Common electrode 38 is positioned at second transparent substrate 14. LC layer 40 is positioned between common electrode 38 and pixel electrode 34. In display panel 50, pixel TFT 18, positioned at transparent substrate 12, includes Si thin film layer 20, source 24, gate terminal 26, and gate oxide layer 28 that partitions Si thin film layer 20 and gate terminal 26 from each other. In display panel 50, Si thin film layer 20 and pixel electrode 34 are in electrical communication with each other through interconnect 36. In display panel 50, a region of interconnect (or via) 36 adjacent to Si thin film layer 20 can function as a drain for pixel TFT 18. Features of the components of display panel 50, including preferred features, each independently are as described above for the components of display panel 10.

Any suitable insulating materials can be employed for spacer 27, passivation layer 30 and insulating layers 29 and 32. Suitable examples include silicon dioxide and silicon nitride. In certain embodiments, at least one of spacer 27, passivation layer 30 and insulating layers 29 and 32 includes silicon dioxide. In certain embodiments, each of spacer 27, passivation layer 30 and insulating layers 29 and 32 independently includes silicon dioxide. When silicon thin film layer 20 is doped by ion implantation, the spacer 27 lowers the doping level in the silicon layer 20 underneath it because ions are implanted through spacer 27 compared to the source or drain region where there is no spacer.

Referring back to the embodiments of FIGS. 1 and 2, and although not shown in these figures, LC layer 40 of each of display panels 10 and 50 independently can further include alignment films. In some embodiments, the alignment films have different rubbing directions, e.g., 90-degrees from each other. Examples of alignment materials for alignment films include polyimide (Pi) materials, such as SE-7511L, SE-1211 and RN-1566, which are available from Japan Nissan Chemical Industrial Ltd. Other suitable vertical alignment materials are also available from JSR Corporation in Japan. The alignment layer can also be fabricated by a suitable method known in the art.

In some specific embodiments, display panels 10 and 50 of the LCDs of the invention each independently further include color filters of red, blue or green (not shown). Color filters can be positioned at either transparent substrate 12 or 14. For example, color filters can be placed at first transparent substrate 12, such as between first transparent substrate 12 and pixel electrode 34. Alternatively, color filters are placed at second transparent substrate 14, for example, between common electrode 38 and second transparent substrate 14. Any suitable color filter materials can be used in the invention, for example, color filter materials available from Japan Dai Nippon Printing and Fuji Film.

The LCDs of the invention can further employ polarizer layers (not shown) at each side of display panel 10 or 50. Polarizer layers can be disposed in either a crossed (e.g., normally white LCD) or parallel geometry (e.g., normally black LCD). Any suitable polarizer materials known in the art can be used in the invention.

Figure 3:
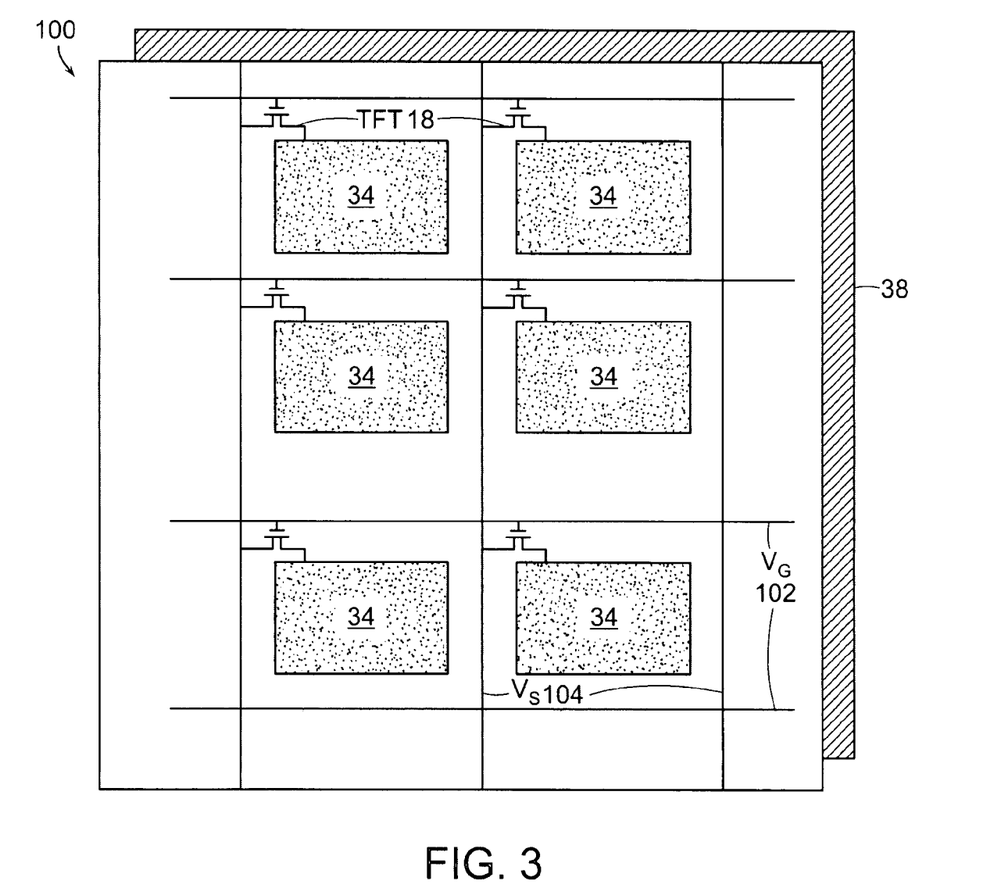
FIG. 3 is a schematic drawing illustrating an active matrix pixel structure of one embodiment of a liquid crystal display device of the invention.

Although in display panels 10 and 50, only one pixel TFT 18 and one pixel electrode 34 are shown, it is noted that a plurality of pixel TFTs 18 and a plurality of pixel electrodes 34, forming an active pixel matrix, can be employed in the invention. In a certain embodiment, as shown in FIG. 3, liquid crystal display 100 of the invention employs an active matrix display including an active pixel matrix of an array of pixel TFTs 18, an array of pixel electrodes 34, and one common electrode 38. As shown in FIG. 3, there is no direct contact between pixel electrodes 34. Rather, each pixel electrode 34 is electrically connected with gate line $V_G$ 102 and source line $V_S$ 104 through pixel TFT 18.

The active pixel matrix of arrays of pixel TFTs 18 and pixel electrodes 34 can be made by any suitable methods known in the art, for example by the methods disclosed in U.S. Pat. Nos. 5,206,749, 5,705,424 and 6,608,654, the entire teachings of which are incorporated herein by reference. In one embodiment, TFT structure 16 (see, for example, FIG. 1) (e.g., including an array of pixel TFTs 18) is made by the methods described in U.S. Pat. No. 5,206,749. As described in U.S. Pat. No. 5,206,749, TFTs 18 is formed from an essentially single crystal Si material having a silicon-on-insulator (SOI) structure. The SOI structure can be fabricated using a number of techniques including recrystallization of non-single crystal Si that has been deposited on a silicon dioxide layer formed on a single crystal Si substrate. This Si or other semiconductor substrate can be removed by etching after bonding of TFT structure 16 to a transparent substrate, such as transparent substrate 12 of FIGS. 1 and 2. Other methods for SOI structure fabrication including the bonding of two wafers with an adhesive and lapping of one wafer to form a thin film and transfer of the thin film onto glass, or alternatively by implantation of oxygen into a silicon wafer, can also be used.

In a certain embodiment, a thin essentially single crystal silicon on insulator (SOI) substrate is used to form TFT structure 16 that includes at least one TFT 18 (see, for example, FIG. 1) using thin-film metallization techniques. The formed TFT structure is then transferred onto an optically transmissive substrate such as glass, quartz, sapphire or transparent plastics. Examples of suitable transfer processes are described in U.S. Pat. Nos. 5,206,749 and 5,705,424. For example, FIGS. 1A-1D of U.S. Pat. No. 5,705,424 illustrate a specific method of forming TFT structure 16 and pixel electrode 34 associated with it. FIGS. 8A-8D of U.S. Pat. No. 5,705,424 illustrate another specific method of forming TFT structure 16 and pixel electrode 34 associated with it.

Pixel electrode 34 or an array of pixel electrodes 34, in certain specific embodiments, are formed prior to transfer of TFT structure 16 onto a transparent substrate. Alternatively, in other certain specific embodiments, pixel electrode 34 or an array of pixel electrodes 34 can be formed after transfer of TFT structure 16 onto a transparent substrate. In these latter embodiments, an interconnect (or via), such as interconnect 36 shown in FIG. 1, is optionally formed to electrically connect pixel TFT 18 of TFT structure 16, and pixel electrode 34.

Figure 4A:
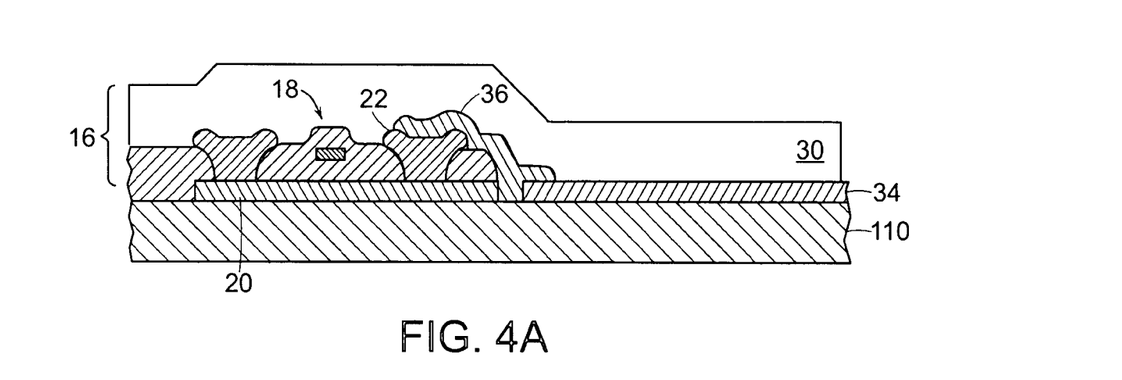
FIGS. 4A-4C are schematic drawings illustrating some embodiments of a method of fabricating a liquid crystal display device of the invention.
Figure 4B:
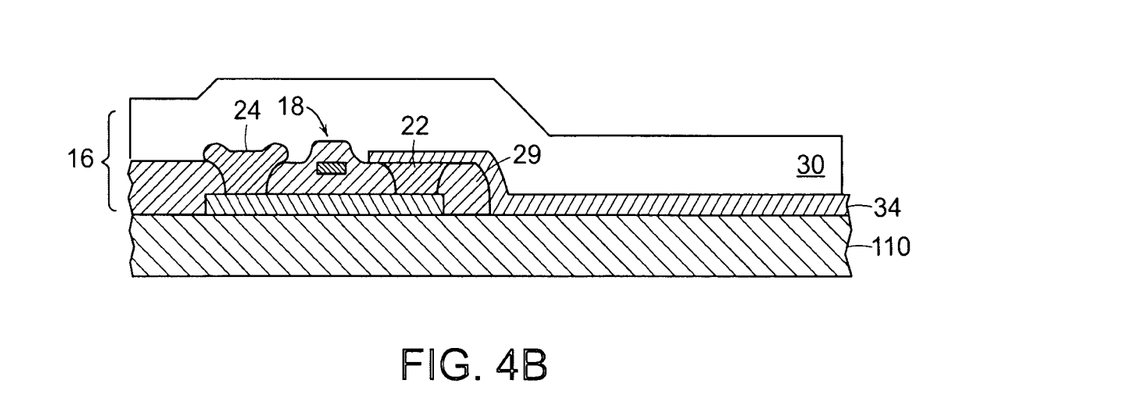
Figure 4C:
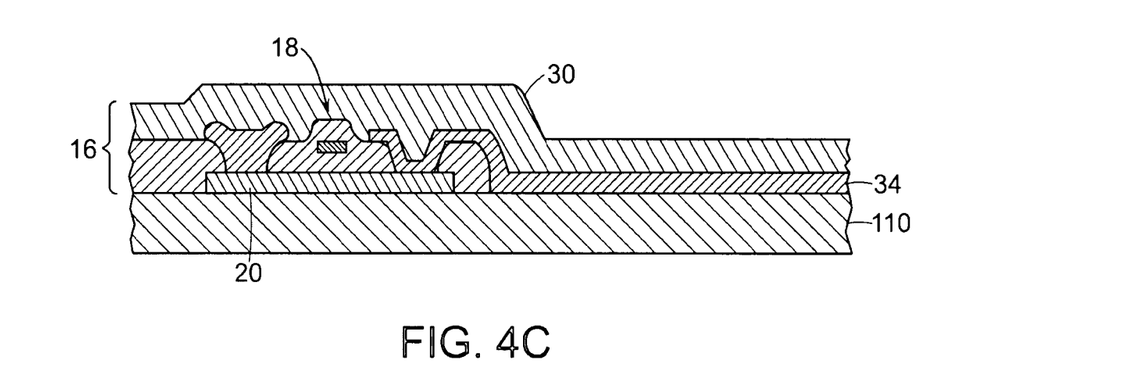

Certain specific embodiments of LCD fabrication methods of the invention are illustrated in FIGS. 4A-4C. In these embodiments, pixel TFT 18 is fabricated with thin film 20 of essentially single crystal Si, pixel electrode 34 is fabricated, and then the fabricated pixel TFT 18 and pixel electrode 34 are transferred onto a transparent substrate (e.g., glass substrate) for further display fabrication. In FIGS. 4A-4C, pixel TFT 18 is formed in Si thin film layer 20 over silicon dioxide insulating substrate 10. The area or region of Si thin film layer 20 in which pixel electrode 34 is to be formed is subjected to a silicon etch to expose the underlying oxide layer 110. Pixel electrode 34 is then formed on or over the exposed area of insulating layer 110. The pixel electrode material includes polycrystalline silicon. In FIG. 4A, pixel electrode 34 is connected to pixel TFT 18 via metal interconnect 36. In FIG. 4B, a portion of the deposited pixel electrode 34 extends up insulating layer 29 of transistor 18, and to contact metallization 22 of pixel TFT 18. In FIG. 4C, pixel electrode 34 is formed on or over a portion of the surface of Si thin film layer 20. Passivation layer 30 is then formed over pixel TFT 18, as shown in FIGS. 4A-4C. The formed TFT structure and pixel electrode 34 are then transferred to an optically transparent substrate (e.g., glass substrate), such as transparent substrate 12 as shown in FIG. 1.

Figure 5A:
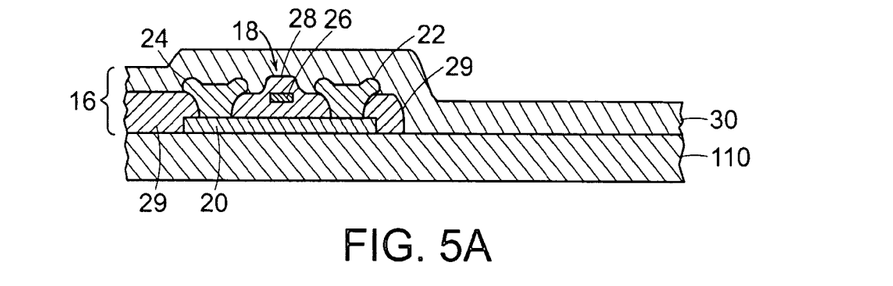
FIGS. 5A-5D are schematic drawings illustrating other embodiments of a method of fabricating a liquid crystal display device of the invention.
Figure 5B:
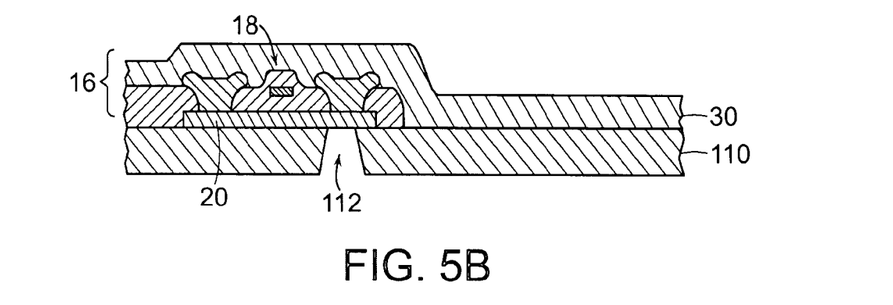
Figure 5C:
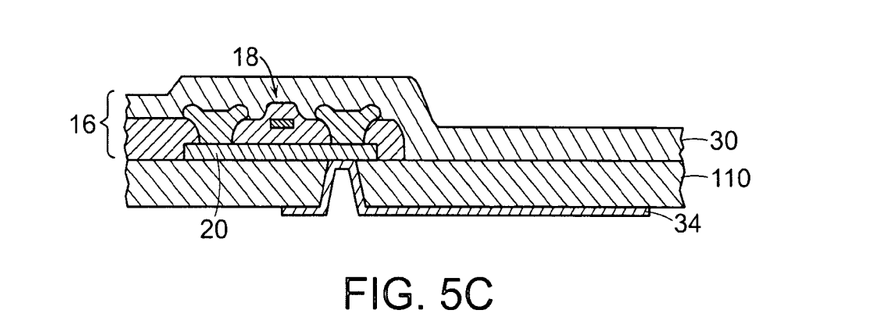
Figure 5D:
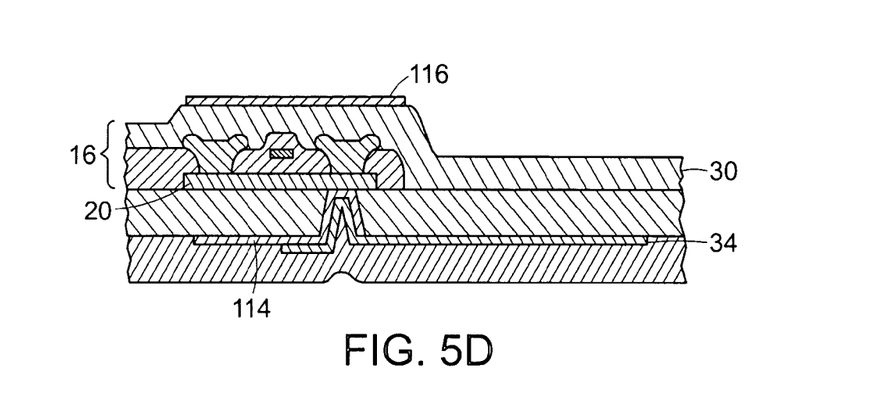

Another certain embodiment of an LCD fabrication method of the invention employs formation of pixel electrode 34 after transfer of TFT structure 16 (e.g., including an array of pixel TFTs 18) onto a transparent substrate. In this embodiment, as shown in FIGS. 5A-5D, after the transfer, pixel electrode 34 is fabricated at an exposed backside of insulating layer 110 on which Si thin film layer 20 has been formed. In FIGS. 5A-5D, the transfer substrate is not shown. Area 112 is formed through insulating layer 110, as shown in FIG. 5B. Pixel electrode 34 is then deposited and patterned to make an electrical contact to pixel TFT 18 (see FIG. 5C). As shown in FIG. 5D, an additional metal layer 114 can be formed between pixel electrode 34 and contact area 112 to improve conductivity. Metal layer 114 can act as interconnect (or via) (for example, interconnect (or via) 36 shown in FIG. 1), and/or can act as an opaque light shield on a first side of TFT structure 16. A separate light shield region 116 can also be formed on a second side of TFT structure 16, e.g., over passivation layer 30 in FIG. 5D.

The structures of FIGS. 4A, 4B, 4C, 5A, 5C and 5D, including pixel TFT 18 and pixel electrode 34, are then attached to common electrode 38, and polarization elements (not shown) and an LC material is then inserted into the cavity formed between pixel electrode 34 and common electrode 38, to form display panel 10 of FIG. 1 or display panel 50 of FIG. 2.

In forming pixel TFT 18 (see, for example, FIG. 1), there generally is loss of Si material in Si thin film layer 20, in particular when the gate oxide 26 is formed and etching the oxide layer 18 to expose Si thin film layer 20 to make ohmic contact for source 24 and drain 22. In addition, there generally is a loss of Si material in Si thin film layer 20 in a drain area of pixel TFT 18 where interconnect (or via) 36 is formed, partly due to various oxidation and etching processes. In a certain embodiment, such loss of Si material is reduced by employing relatively thin gate oxide 28, having a thickness, for example, in a range of between about 50 nm and about 100 nm, and preferably between about 50 nm and about 70 nm (e.g., about 60 nm). In another certain embodiment, a selective dry etching or wet etching process, having a silicon oxide:Si selectivity ratio of over about 5:1, such as a silicon oxide:Si selectivity ratio in a range between about 10:1 and about 100:1, is employed for etching processes involving Si thin film layer 20, for example, the etching process for producing contact area 112 of FIG. 5B. With one or more these methodologies, the residual portion of Si thin film layer 20, where interconnect (or via) 36 is formed, can have a thickness in a range of between about 100 nm and about 200 nm. With such thickness, a reliable metal contact to Si thin film layer 20 can be achieved.

Si thin film layer 20 of pixel TFT 18 can include a P-type transistor channel or an N-type transistor channel. In a specific embodiment, Si thin film layer 20 includes a P-type transistor channel. In a more specific embodiment, Si thin film layer 20 is implanted with 120,000 eV (electron volt) $P^+$ (positive phosphorous ion) to a level of about $2\times10^{12}$ $cm^{-2}$, and with 80,000 eV $BF^{2+}$ (doubly charged positive barium fluoride ion) to a level of about $2.4\times10^{12}$ $cm^{-2}$, to thereby form a P-type transistor channel and a main body.

In another specific embodiment, a lightly doped drain (LDD) structure is employed for pixel TFT 18 in the invention to reduce pixel transistor leakage current. The LDD structure can be made between a transistor gate region and a source or drain region. The impurity level (i.e., doping concentration) in the LDD region is moderately high, but lower than the level in the source and drain region. In a more specific embodiment, the LDD structure utilizes spacer 27 (see FIGS. 1 and 2) around gate terminal 26. Spacer widths "b1" and "b2" shown in FIGS. 1 and 2, for example, each independently are in a range of between about 300 nm and about 800 nm, such as between about 500 nm and about 800 nm (e.g., about 600 nm each). The doping level in the silicon layer 20 of the LDD region is lower than in the source and drain region because the ion implantation in the LDD region is performed through the spacer layer 27.

In yet another specific embodiment, pixel TFT 18 employs an LDD structure that utilizes spacer 27 (see FIGS. 1 and 2) around gate terminal 26, and has a threshold voltage of about −1.6 V, ON current of about 0.021 mA at about −9 V drain voltage and about −9 V gate voltage, and OFF current less than about 1 fA at about −9 V drain voltage and about −9 V gate voltage, resulting in ON/OFF current ratio greater than about $10^7$. Features of spacer 27, including preferred features, are as described above.

Integrated control circuits (ICCs) known in the art can be employed as a control circuit for driving the LCD panels of the LCDs of the invention. Preferably, a CMOS (Complementary Metal-Oxide-Semiconductor) circuitry utilizing a single crystal silicon-on-insulator (SOI) starting material is employed in the invention. Such a CMOS can be driven by a dc common drive scheme or by an ac-coupled drive scheme, known in the art, for example, in Richard, A. and Herrmann, F. P., "A New Drive Scheme Architecture for AMLCDs Used in Microdisplays," *Information Display*, pp 14-17 (2005), the entire teachings of which are incorporated herein by reference. For example, the CMOS can be driven by an ac-coupled drive scheme.

Figure 6:
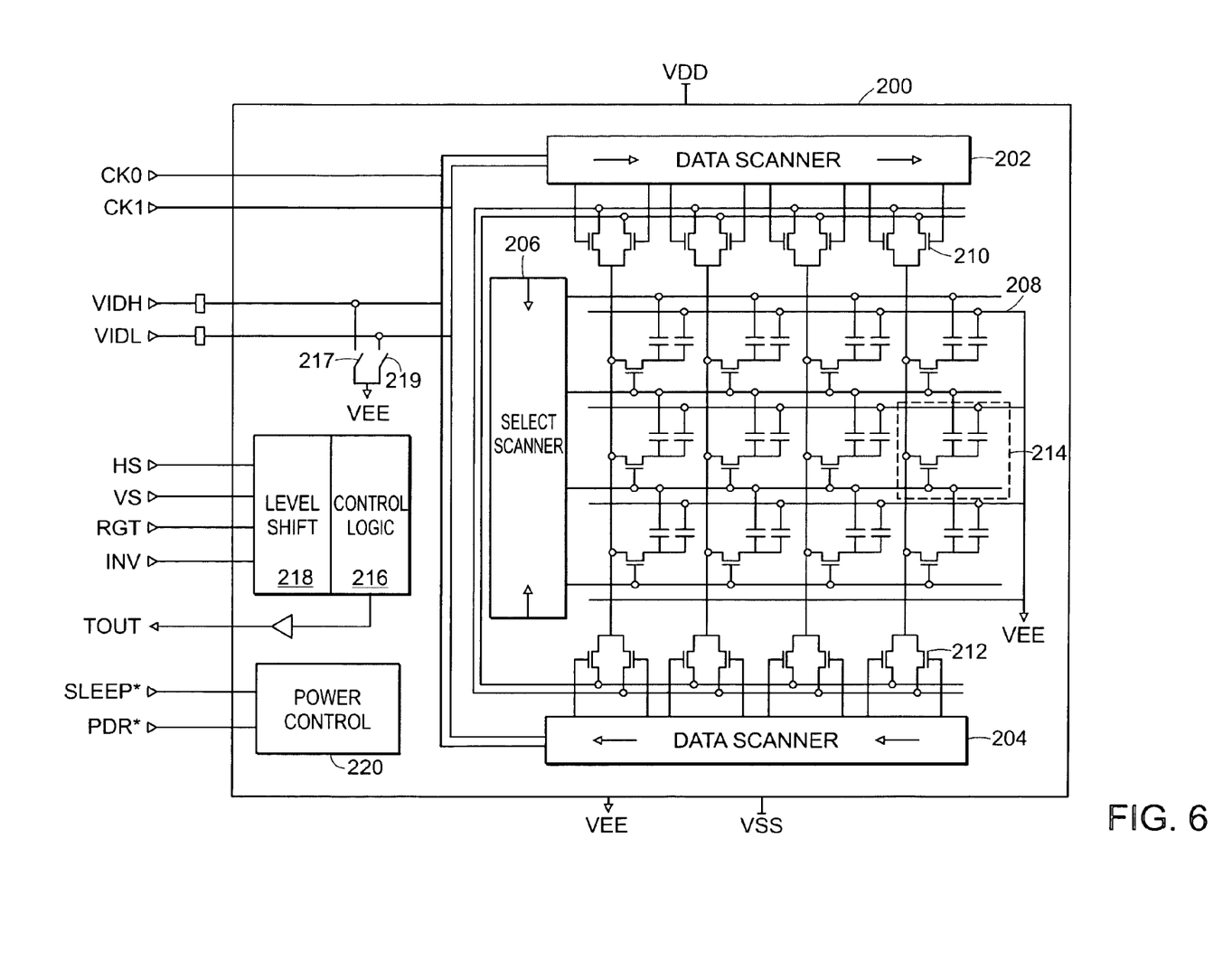
FIG. 6 is a schematic circuit diagram of an integrated control circuit that can be employed in the invention.

Referring to FIG. 6, an embodiment of active matrix display 200 of the invention is shown. The active matrix display 200 includes an active matrix pixel array 208, and integrated control circuits that include data scanners 202 and 204, a plurality of transmission gates 210 and 212, control logic circuit 216, integrated switches 217 and 219, level shifter 218, and power control 220. The active matrix pixel array 208 has a plurality of pixel elements 214, each of which is defined by pixel electrode 34 and its corresponding pixel TFT 18 (not shown in FIG. 6). The integrated control circuits drive the active matrix pixel array 208. An RGT input selects one of the two data scanners (202 and 204) for left-to-right (202) or right-to-left (204) horizontal scanning. Select scanner 206 scans vertically from top to bottom. Data scanners 202, 204 accept logic-level clock inputs directly from the input pads, thereby reducing the power dissipation and skew otherwise associated with internal clock drivers (not shown). Complementary video signals are accepted on the AC-coupled VIDH and VIDL inputs, with internal switches 217 and 219, respectively, restoring DC levels during the horizontal retrace interval. The VIDH and VIDL signals carry video signals to the transmission gates 210 and 212.

In some embodiments, a CMOS control circuitry is employed in the invention. In a specific embodiment, at least one control TFT that includes Si thin film layer 20 having a thickness in a range of between about 100 nm and about 200 nm is employed in the integrated control circuits for driving the display panel (e.g., display panel 208) of an LCD of the invention. In one specific embodiment, at least one of data scanners 202 and 204, internal switches 217 and 219, clock driver, shift register, and level shifter 218 employs such a control TFT. Features of such control TFT, including preferred features, are as described above for pixel TFT 18. In another specific embodiment, the CMOS control circuitry is formed in the same Si thin film material in which pixel TFTs 18 are formed. In this embodiment, the CMOS control circuitry is capable of being fully interconnected to a display panel (e.g., display panel 208) of an LCD of the invention, without the need for wires and wire bonding.

In a certain embodiment, the integrated control circuits (ICCs) include a shift register circuit which directly accepts low voltage clock signal inputs without using clock buffers, as described in U.S. Provisional Application No. 60/860,059, filed Nov. 20, 2006, the entire teachings of which are incorporated herein by reference. The shift register circuit is adapted to operate with a low voltage swing clock signal, and has a state node driven directly by a single transistor state input.

In another certain embodiment, the integrated control circuits (ICCs) include one or more DC-restore switches that are integrated within an LCD of the invention. In these embodiments, the LCD includes a coupling capacitor coupled at one end to a system input video signal, the coupling capacitor providing a display input video signal having a DC level offset. An LCD panel, such as, display panel 10 or 50, coupled to another end of the coupling capacitor receives a first display input video signal at a video input for driving the display panel. A switch integrated within the LCD device provides DC restore to the coupling capacitor. Suitable examples of DC-restore switches that can be employed in the invention can be found in U.S. Pat. No. 7,138,993, the entire teachings of which are incorporated herein by reference. In a specific embodiment, the LCD of the invention, in addition to a display panel as described above (e.g., display panel 10 or 50), includes a system input video signal; a first amplifier having a first gain for amplifying the system input video signal to provide a first display input video signal at an output; a first coupling capacitor coupled at one end to the first amplifier output, the first coupling capacitor providing a first DC level offset to the first display input video signal; a first video input which is integrated in the display panel and coupled to another end of the first coupling capacitor to receive the first display input video signal for driving the display panel; and a first switch which is integrated in the display panel and coupled to the first video input that provides DC restore to the first coupling capacitor. In another specific embodiment, the first integrated switch provides DC restore to the first coupling capacitor when operated during a retrace interval of the system input video signal. In a more specific embodiment, the LCD of the invention further includes a second amplifier having a second gain for amplifying the system input video signal to provide a second display input video signal, the second gain opposite in polarity to the first gain such that the second display input video signal is a complement of the first display input video signal; a second coupling capacitor coupled at one end to the second amplifier output, the second coupling capacitor providing a second DC level offset to the second display input video signal; a second video input which is integrated in the display panel and coupled to another end of the second coupling capacitor to receive the second display input video signal for driving the display panel; and a second switch which is integrated in the display panel and coupled to the second video input that provides DC restore to the second coupling capacitor. In yet another specific embodiment, the first and second integrated switches provide DC restore to the first and second coupling capacitors, respectively, when operated during a retrace interval of the system input video signal.

In yet another embodiment, a heater circuit is fabricated with the integrated control circuits, which employs a common voltage polysilicon line to supply heat to the display panel of the LCDs of the invention. The common voltage line can also be made with metal silicides, such as tungsten silicide, to supply higher current than the poly silicon line. The common voltage line of the heater line is in controlling relation to common electrode 38, and is electrically connected to two or more of pixel TFTs 18 at a point other than gate terminal 26, and has two terminals to provide a first node and a second node. The heater circuit controls voltages provided to both the first node and the second node, such that a voltage difference between the first and the second nodes causes current to flow through the common voltage line, and to thereby heat pixels defined by pixel electrodes 34. Such a heater circuit is described in U.S. application Ser. No. 11/784,215, filed Apr. 5, 2007, the entire teachings of which are incorporated herein by reference.

The LCDs of the invention can be any types of liquid crystal displays, including transmissive displays. Preferably, the LCDs of the invention are used in head-mounted display systems.

It is noted that definitions provided in this application and reference characters referring to certain components shown in FIGS. 1-6 prevail over those provided in references cited and incorporated by reference herein, if there is any conflict.

EXEMPLIFICATION

Example 1

Performance Data of LCDs of the Invention

A standard LCD as a control, and an LCD of the invention, each of which was a QVGA resolution display, were tested for their performance. The standard LCD included TFTs having the thickness of about 300-320 nm and the LCD of the invention included TFTs having the thickness of between about 150-200 nm. The pixel electrode material is polycrystalline Si. As shown in Table 1, the LCD of the invention had superior properties, for example, in image retention, photosensitivity, brightness and contrast ratio.

TABLE 1

|  | Standard LCD | LCD of the Invention | Units |
| --- | --- | --- | --- |
| Contrast Ratio | 90 | 115 | White/Black |
| Transmission | 2.5% | 2.5% | White/Backlight |
| Max Display Brightness | 350 | 700 | cd/m$^2$ |
| Max Backlight Brightness | 14,000 | 28,000 | cd/m$^2$ |
| Max Ambient Light Photosensitivity (diffused) | 200 | 1000 | Lux |
| Flicker (60 Hz) | −40 | −60 | dB |
| Image Retention | 1% | 0.5% | % of full gray scale |

EQUIVALENTS

While this invention has been particularly shown and described with references to preferred embodiments thereof, it will be understood by those skilled in the art that various changes in form and details may be made therein without departing from the scope of the invention encompassed by the appended claims.

What is claimed is:

1. A liquid crystal display, comprising a display panel that includes:
   a) at least one pixel transistor that includes a thin film layer of essentially single crystal silicon that has a thickness in a range of between about 100 nm and about 200 nm, a gate oxide layer over the silicon thin film layer, and a gate terminal over the gate oxide layer;
   b) at least one pixel electrode in electrical communication with the pixel transistor and having a thickness in a range of between about 5 nm and about 20 nm;
   c) at least one common electrode over the pixel electrode having a thickness of between about 50 nm and about 200 nm;
   d) a liquid crystal material between the pixel electrode and the common electrode; and
   e) first and second spacers above the gate oxide layer and sandwiching the gate terminal.

2. The liquid crystal display of claim 1, further including a bonding layer between the transparent substrate and the pixel transistor.

3. The liquid crystal display of claim 1, wherein the thickness of the silicon thin film layer is in a range of between about 150 nm and about 200 nm.

4. The liquid crystal display of claim 3, wherein the thickness of the silicon thin film layer is about 200 nm.

5. The liquid crystal display of claim 1, wherein the pixel electrode includes polysilicon.

6. The liquid crystal display of claim 1, wherein the pixel electrode includes an indium tin oxide.

7. The liquid crystal display of claim 1, wherein the common electrode includes an indium tin oxide.

8. The liquid crystal display of claim 1, further including a first transparent substrate and a second transparent substrate, wherein the pixel transistor, the pixel electrode, the common electrode, and the liquid crystal material are between the first and the second transparent substrates.

9. The liquid crystal display of claim 8, wherein at least one of the first and the second transparent substrates includes at least one member chosen from glass, fused silica and sapphire.

10. The liquid crystal display of claim 1, wherein the pixel transistor is a metal-oxide thin film transistor that includes a drain, a source, wherein each of the drain and the source independently is in electrical contact with the silicon thin film layer.

11. The liquid crystal display of claim 1, wherein the gate oxide layer has a thickness in a range of between about 50 nm and about 150 nm.

12. The liquid crystal display of claim 1, wherein the gate oxide layer has a thickness in a range of between about 50 nm and about 100 nm.

13. The liquid crystal display of claim 1, wherein the gate oxide layer includes silicon dioxide.

14. The liquid crystal display of claim 1, wherein the gate terminal includes polysilicon.

15. The liquid crystal display of claim 1, wherein at least one of the first and second spacers has a width, measured from a gate terminal-spacer boundary, at the gate terminal, to the source, in a range of between about 300 nm and about 800 nm.

16. The liquid crystal display of claim 15, wherein the width is in a range of between about 500 nm and about 800 nm.

17. The liquid crystal display of claim 16, wherein the width is about 600 nm.

18. The liquid crystal display of claim 1, wherein at least one of the first and second spacers, has a width, measured from a gate terminal-spacer boundary, at the gate terminal, to the drain, in a range of between about 300 nm and about 800 nm.

19. The liquid crystal display of claim 18, wherein the width is in a range of between about 500 nm and about 800 nm.

20. The liquid crystal display of claim 19, wherein the width is about 600 nm.

21. The liquid crystal display of claim 1, further including an interconnect connecting the silicon thin film layer and the pixel electrode, wherein the Si thin film layer and the pixel electrode are in electrical communication with each other through the interconnect.

22. The liquid crystal display of claim 1, further including a control circuit for driving the display panel, which includes a shift register, clock driver and input level shifter.

23. The liquid crystal display of claim 22, wherein the control circuit includes at least one control transistor that includes a thin film layer of essentially single crystal silicon, the silicon thin film layer having a thickness in a range of between about 100 nm and about 200 nm.

24. The liquid crystal display of claim 23, wherein the control transistor is included in at least one of the shift register, clock driver and input level shifter.

25. A liquid crystal display, comprising a display panel that includes:
   a) a pixel transistor that includes a thin film layer of essentially single crystal silicon that has a thickness in a range of between about 100 m and about 200 nm;

b) a pixel electrode in electrical communication with the pixel transistor and having a thickness in a range of between about 5 nm and about 20 nm;
c) at least one common electrode over the pixel electrode having a thickness of between about 50 nm and about 200 nm;
d) a liquid crystal material between the pixel electrode and the common electrode; and
e) an interconnect connecting the thin film layer of essentially single crystal silicon and the pixel electrode, wherein the thin film layer and the pixel electrode are in electrical communication with each other via the interconnect.

* * * * *